(12) United States Patent
Schmidt

(10) Patent No.: US 7,098,748 B2
(45) Date of Patent: Aug. 29, 2006

(54) INTEGRATED CMOS HIGH PRECISION PIEZO-ELECTRICALLY DRIVEN CLOCK

(76) Inventor: Dominik J. Schmidt, 580 Arastradero Rd., Palo Alto, CA (US) 94306

( * ) Notice: Subject to any disclaimer, the term of this patent is extended or adjusted under 35 U.S.C. 154(b) by 143 days.

(21) Appl. No.: 09/962,937

(22) Filed: Sep. 21, 2001

(65) Prior Publication Data

US 2003/0058057 A1    Mar. 27, 2003

(51) Int. Cl.
 *G01N 27/00* (2006.01)
 *H03L 1/00* (2006.01)
(52) U.S. Cl. .......................... 331/176; 331/65; 331/66
(58) Field of Classification Search ................ 331/176
 See application file for complete search history.

(56) References Cited

U.S. PATENT DOCUMENTS

| | | | | |
|---|---|---|---|---|
| 3,719,838 A | * | 3/1973 | Peduto et al. ............... | 310/315 |
| 4,254,382 A | * | 3/1981 | Keller et al. ............ | 331/116 R |
| 4,376,919 A | * | 3/1983 | Konno et al. ............... | 310/315 |
| 4,746,879 A | * | 5/1988 | Ma et al. ............... | 331/116 FE |
| 4,949,055 A | * | 8/1990 | Leitl .......................... | 331/158 |
| 5,473,289 A | * | 12/1995 | Ishizaki et al. ......... | 331/116 R |
| 5,621,341 A | | 4/1997 | Schrader et al. ............ | 327/102 |
| 5,644,270 A | | 7/1997 | Moyer et al. .................. | 331/34 |
| 5,705,957 A | * | 1/1998 | Oka et al. ..................... | 331/66 |
| 5,739,728 A | | 4/1998 | Kim ........................... | 331/111 |
| 5,745,012 A | | 4/1998 | Oka et al. ..................... | 331/68 |
| 5,751,775 A | * | 5/1998 | Fensch et al. ............... | 375/371 |
| 5,774,800 A | * | 6/1998 | Mori .......................... | 455/255 |
| 5,878,331 A | | 3/1999 | Yamamoto et al. ........... | 455/83 |
| 5,892,408 A | * | 4/1999 | Binder ........................ | 331/44 |
| 6,049,702 A | | 4/2000 | Tham et al. ................... | 455/78 |
| 6,157,821 A | * | 12/2000 | Boesch et al. ............... | 455/260 |
| 6,158,283 A | | 12/2000 | Shinogi et al. .......... | 73/514.33 |
| 6,249,155 B1 | | 6/2001 | Hartman et al. ............ | 327/106 |
| 6,362,699 B1 | * | 3/2002 | Fry ............................. | 331/176 |
| 6,563,354 B1 | * | 5/2003 | Jha ............................. | 327/156 |
| 6,928,275 B1 | * | 8/2005 | Patrick et al. ............... | 455/256 |

OTHER PUBLICATIONS

Semiconductor Manufacturing: An Overview. Accessed Jun. 22, 2001. http://users.ece.gatech.edu/~gmay/overview.html.
Kane, Bart J., et al. "A CMOS Compatible Traction Stress Sensor Array for use in High Resolution Tactile Imaging" http://transducers.stanford.edu/stl/Projects/traction.html. Accessed Jul. 27, 2001.
C.T.-C. Nguyen "Communications Applications of Microelectromechanical Systems". Proceedings, 1998 *Sensors Expo*, San Jose, CA, May 19-21, 1998. pp. 447-455.

* cited by examiner

Primary Examiner—Tuan T. Lam

(57) ABSTRACT

A clock oscillator embedded in an integrated circuit, including a piezoelectric resonator formed on the integrated circuit; a clock generator coupled to the on-chip piezoelectric resonator, one or more sensors adapted to sense one or more environmental parameters affecting the piezoelectric resonator; and a processor coupled to the clock generator and the one or more sensors to adjust the frequency of the clock generator based on the one or more environmental parameters.

16 Claims, 5 Drawing Sheets

INTEGRATED CMOS HIGH PRECISION PIEZO-ELECTRICALLY DRIVEN CLOCK

BACKGROUND

The invention relates to a piezo-electrically driven clock oscillator.

In recent years, great reductions in cost, size and weight have been achieved in various information equipment including portable computers, personal digital assistants (PDAs), and mobile communication systems such as mobile telephones. As a result, the size and thickness of piezoelectric and voltage-controlled oscillators for use in these devices must be reduced. U.S. Pat. No. 5,745,012 to Oka, et al. shows a conventional piezoelectric oscillator employing a quartz-crystal resonator as a piezoelectric resonator and a conventional voltage-con-trolled (crystal) oscillator (VCXO). In the conventional quartz-crystal oscillator, a CMOS IC chip is mounted by a conductive adhesive on an island that is a part of a lead frame. The IC chip is electrically connected to input/output lead terminals by wires. A quartz-crystal resonator includes a cylinder shaped quartz chip and is electrically connected to the gate electrode and the drain electrode of the IC chip. The IC chip, the quartz-crystal resonator and parts of input/output lead terminals are molded by transfer molding with an epoxy resin molding resin to form a plastic package of the quartz-crystal oscillator. In another conventional voltage-controlled oscillator, electric circuit components such as a transistor and variable-capacitance diode are mounted on a substrate that is fixed by solder on the stem of a metal can package. A quartz-crystal resonator is also mounted on the substrate. The can is hermetically sealed by resistance welding for example. In another common type, a trimmer capacitor or the like is provided on the substrate and an adjusting hole is formed in the can so that the frequency may be adjusted after the voltage-controlled oscillator is mounted on a circuit board installed in a device such as a mobile communication system.

In the conventional piezoelectric and voltage-controlled oscillators described above, the piezoelectric resonator is accommodated in a cylinder case having a diameter of about 3 mm. As a result, the piezoelectric or voltage-controlled oscillator has a large height such as about 4.5 mm to 7 mm. Thus, its total volume is as great as 0.5 cc to 1.0 cc. The conventional piezoelectric and voltage-controlled oscillators of this type does not meet the small-size requirements that are essential in small-sized electronic devices such as PDAs, portable computers or mobile wireless devices such as cellular telephones. Also, crystals are expensive and there is difficulty in designing and producing a low cost piezoelectric element (such as a quartz chip) having such a small size while maintaining the required performance.

SUMMARY

A clock oscillator embedded in an integrated circuit, including a piezoelectric resonator formed on the integrated circuit; a clock generator coupled to the on-chip piezoelectric resonator; one or more sensors adapted to sense one or more environmental parameters affecting the piezoelectric resonator; and a processor coupled to the clock oscillator and the one or more sensors to adjust the frequency of the clock oscillator based on the one or more environmental parameters.

Advantages of the above system may include one or more of the following. Silicon piezo-crystals are quite favorable because of their utilization of integrated circuit and micro-machining techniques, enabling miniature devices with precise dimensions, batch fabrication of sensors, and good reproducibility. The system minimizes temperature dependent variations of the frequency signal generated by an on-chip piezoelectric resonator based frequency source. The system requires less power and stabilizes frequency faster than a typical oven stabilized crystal oscillator. The system provides a higher frequency stability than a typical temperature compensated crystal oscillator and provides frequency stability that is comparable to an oven stabilized crystal oscillator. Further, these embodiments are very cost-effective, since the same silicon substrate is used for both the oscillator crystal and the control electronics

DESCRIPTION

Figure 1:
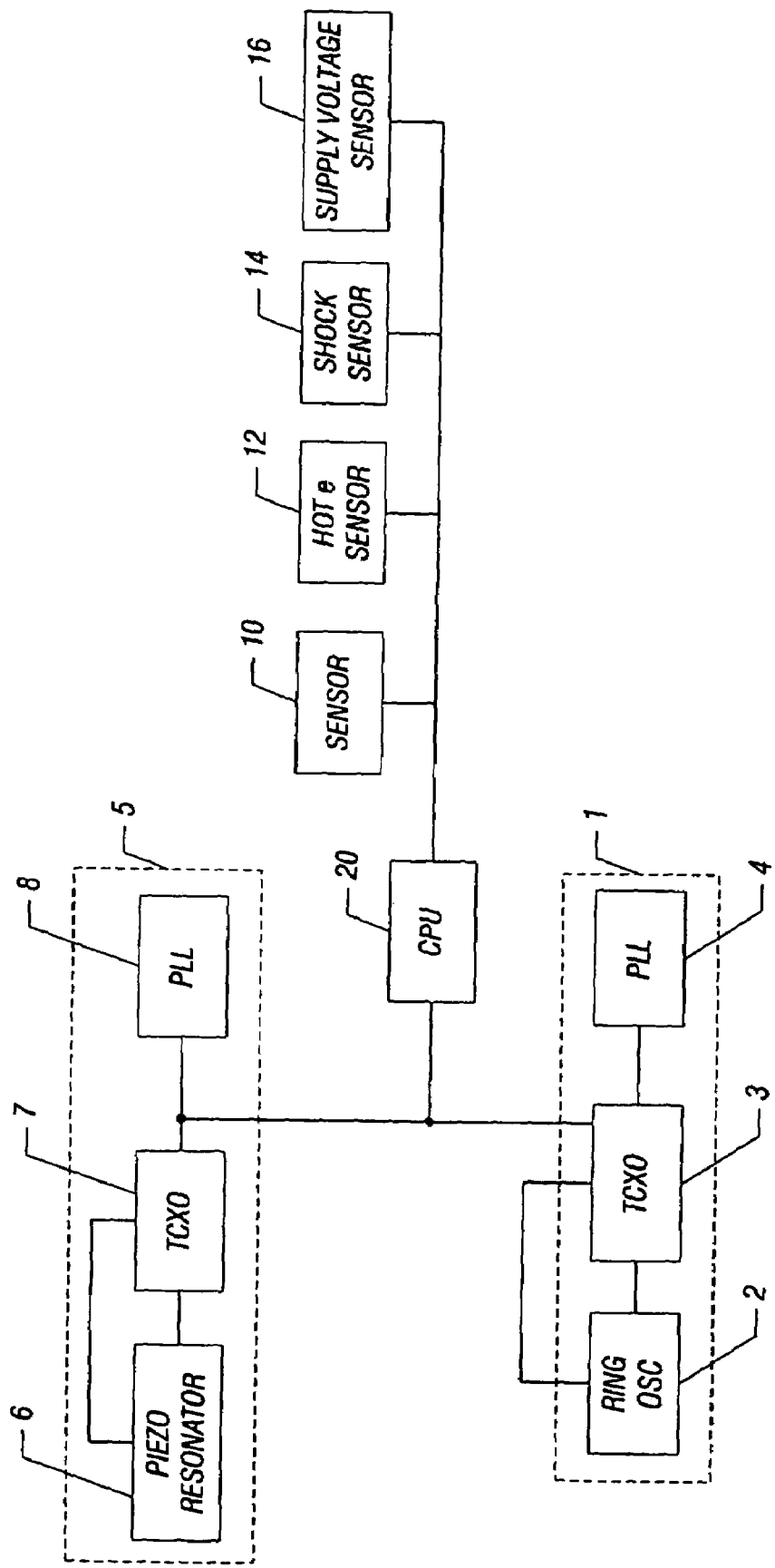
FIG. 1 shows one embodiment of an on-chip frequency generator.

FIG. 1 shows one embodiment of a frequency generator that is constructed completely on a single chip without requiring external components such as crystals or capacitors to minimize cost The generator has a reference oscillator 5 that provides a reference frequency to calibrate a primary oscillator 1. The reference oscillator 5 includes a piezoelectric resonator 6 connected to a temperature compensated oscillator circuit (TCXO) 7 whose output drives a phase locked loop 8. The primary oscillator 1 includes a ring oscillator 2 that drives a primary TCXO 3. The output of the TCXO 3 drives a second PLL 4.

Various TCXO circuits can be used. For example, the TCXO 7 includes an inverter, a feedback resistor, and an oscillation capacitor. A piezoelectric resonator and a varactor or a variable capacitance diode 66 are connected in series between the input and output terminals of the inverter. A DC-cutting capacitor is disposed between the diode and the inverter. The node between the piezoelectric resonator and the diode is connected to ground by a bias resistor. A control voltage or modulation signal is applied to the node between the variable-capacitance diode and the DC-cutting capacitor to change the capacitance of the variable-capacitance diode and thus the oscillation frequency.

Various sensors are positioned on the chip to provide feedback to ensure clock accuracy A temperature sensor 10, a hot electron sensor 12, and a shock sensor 14, among others, are positioned at various locations on the chip. To illustrate, the temperature sensor 10 can be a diode with metallization to screen out light, or can be a thermistor. The output from the temperature sensor 10 is digitized and provided to a processor or central processing unit (CPU) 20 for adjusting the IC To calibrate the temperature sensors 10, one or more heaters, which can be polysilicon resistors placed over a diode and transistors, can be provided on-chip. The heaters can also be used to bring the IC to a predetermined temperature range if the IC is below its normal operating temperature. The processor 20 can check the temperature at different locations on the IC and average the temperature being sensed to better adjust to the actual temperature present. By monitoring the temperature of the IC, the processor 20 can detect whether the oscillator is deviating from its specified frequency. In one embodiment, the flash memory has a parameter array with one element storing the operating temperature of the IC. The operating temperature information is used to generate differing delays based on circuit characteristics and based on temperature-induced shifts in oscillator frequency. The processor 20 adjusts the timing when the temperature changes outside the nominal setting by changing the number of the delay stages to compensate for the temperature range variations. Also shown is a supply voltage sensor 16.

The sensors 10–16 provide feedback information to the CPU 20, which is connected to memory including random access memory (RAM) and read only memory (ROM) as is conventional. The CPU 20 performs other processing task as well and is not dedicated to the clock circuit of FIG. 1. Thus, cost is reduced since a dedicated CPU is not needed.

Figure 2:
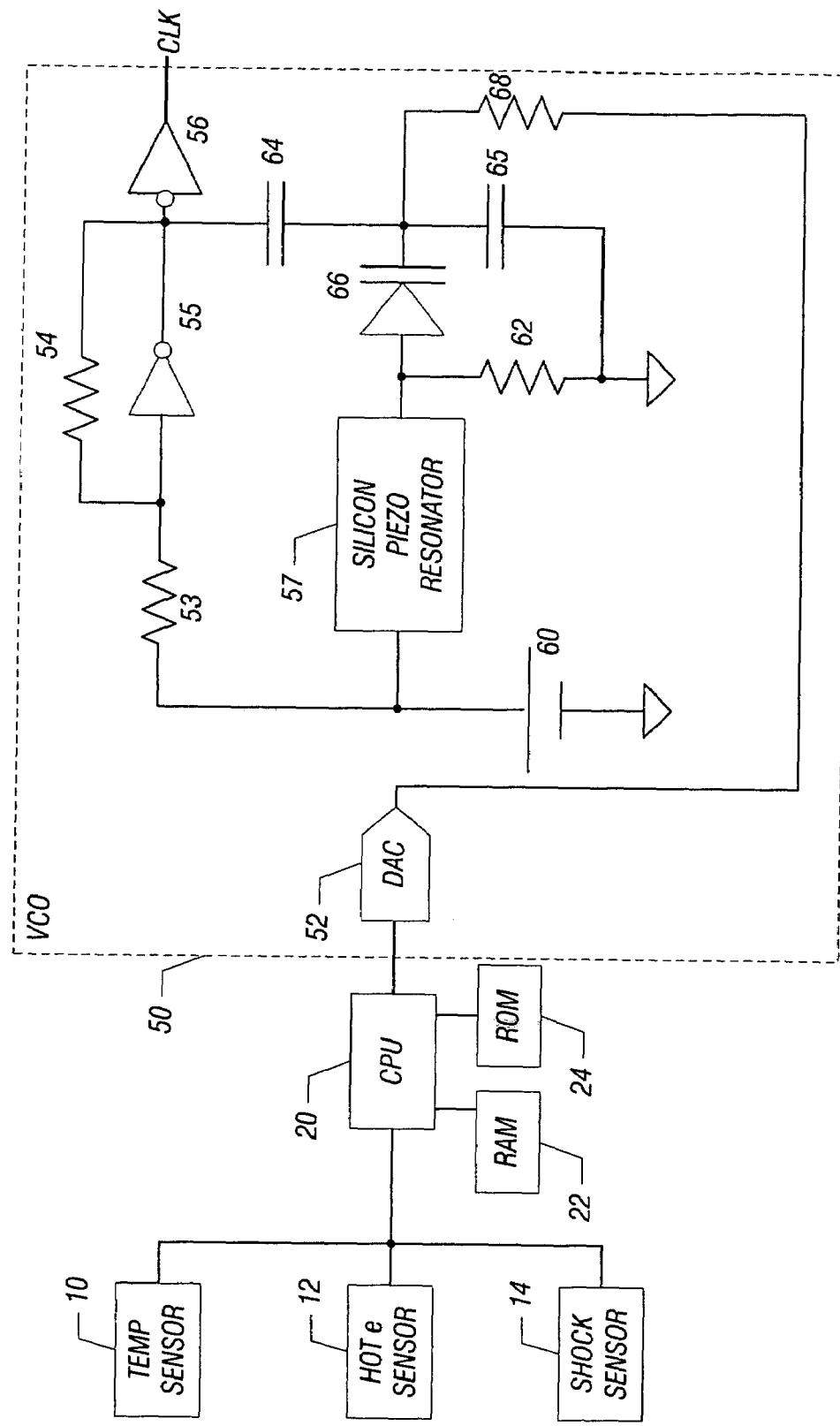
FIG. 2 shows a second on-chip frequency generator.

FIG. 2 shows more detail

Figure 3:
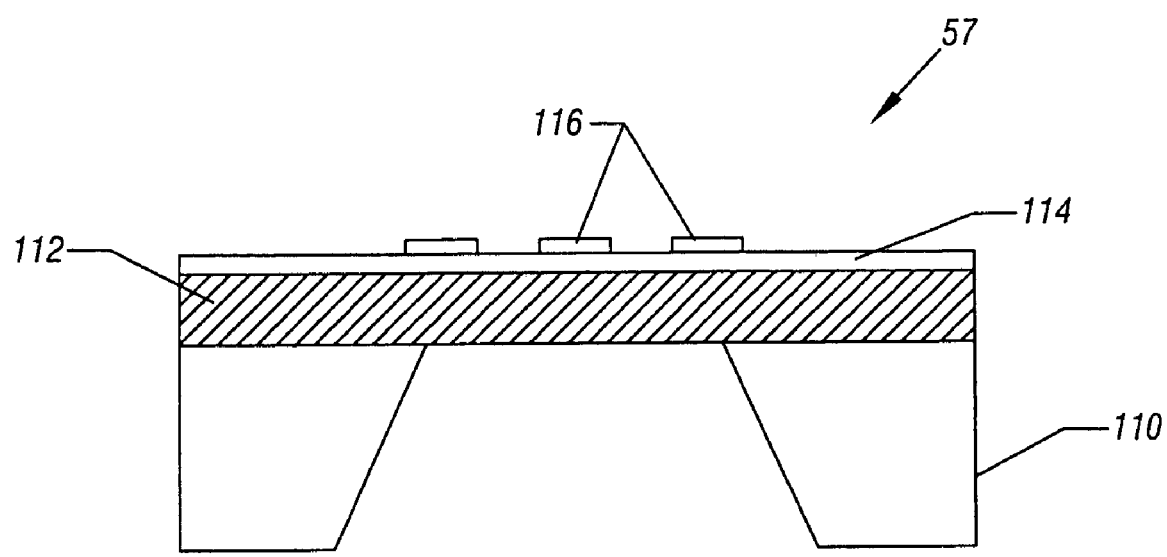
FIG. 3 shows an exemplary piezoelectric resonator.

FIG. 3 shows an exemplary piezoelectric resonator 57. In this resonator, a silicon substrate 110 is deposited with a boron doped silicon layer 112. Next, a piezoelectric film 114 is formed above the boron doped silicon layer 112. The film 114 is a deflectable thin diaphragm composed of a piezo-electric material, zinc oxide (ZnO). A transduction operation is based on the piezoelectric effect, in which an acoustical pressure applied to a polarized ZnO crystal results in a mechanical deformation, creating an electrical charge. Movements of the diaphragm produce stress in the ZnO and thus, produce a dielectric displacement current perpendicular to the plane of the diaphragm. Electrodes 116, placed in the region of greatest bending stress, are used to collect the surface charges of the ZnO and a charge amplifier is used to measure the charge. In another embodiment, the sensing element is also made of silicon. Polysilicon films are doped with a high concentration of boron exhibit piezo-electric properties. A set of boron-doped polysilicon cantilevers fabricated on a standard silicon wafer can be used to generate an oscillating motion which will be proportional to the oscillator size and geometry. Since charge amplifiers can be designed with very high sensitivity in CMOS, even a small oscillation level is sufficient to create a very stable clock waveform. The piezoelectric resonator thus is made using an integrated piezo-electric film, for example an integrated ZnO film. The doped polysilicon cantilever deposited over a pit etched with TMAH. In this arrangement, oxide is grown, polysilicon (poly) is deposited and patterned and then boron is implanted into the poly. Contacts are etched through the oxide and metal electrodes are deposited and patterned. The poly is subsequently undercut using a tetramethyl-ammonium hydride (TMAH) etch, resulting in a cavity under the poly. This cavity allows the poly to flex, and the poly motion is translated into a piezo-electric voltage.

In another embodiment, a portion of the integrated circuit is heavily implanted, and the implanted portion is used as an oscillator. An epitaxial wafer has a lightly doped surface (about 10 microns deep). The rest of the wafer is heavily doped, in this case with boron. In fact, the wafer will be doped to saturation with boron, turning it into a piezo-electric crystal. The lightly doped layer on top of the wafer is deposited at high temperature epitaxially (with only a small increase in wafer cost). The active devices are all grown in this layer, which is basically the same doping as a regular wafer. The heavy doping of the substrate is reached through the lightly doped layer with a highly energetic implant. This epitaxial technology is currently being used in bipolar silicon processes, but by using the entire wafer as a single crystal and combining this crystal with geometrically placed electrodes and high-sensitivity charge sensors (on-chip transistor gates connected directly to the substrate). These sensors can measure very small charge fluctuations, which are then fed back into the substrate to set up an extremely well controlled oscillation (parts per million frequency control). The placement of the electrodes is important so that surface waves can be controlled and accurately modeled along with the bulk piezoelectric waves. Finally, the whole assembly is mounted in a flexible package to allow for the oscillations. To do this, a 4-point epoxy mounting is used in one emboidment. The chip substrate can be grounded from the surface, since the high doping makes the substrate resistivity low and obviates the need for a back-contact.

Figure 4A:
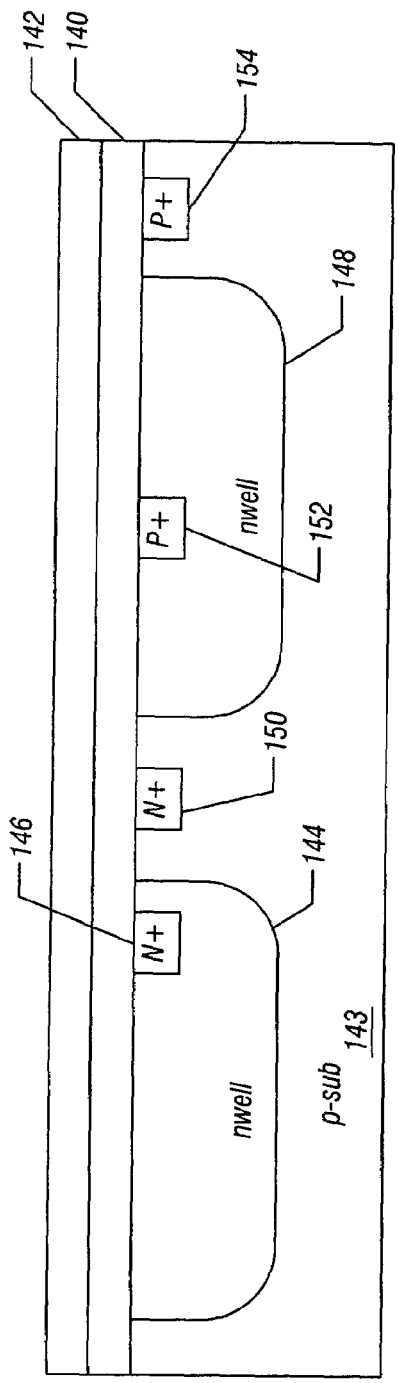
FIG. 4A illustrates an exemplary substrate hot electron sensor that senses hot electron presence during operation.
Figure 4B:
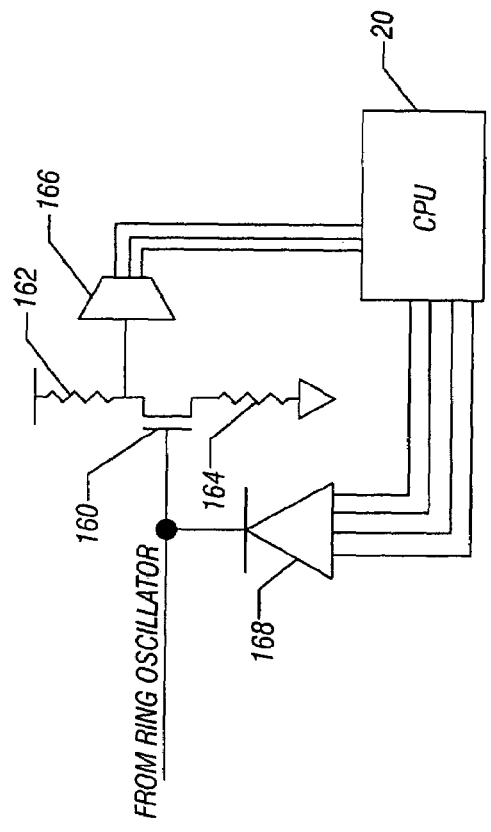
FIG. 4B shows an embodiment that senses device degradation due to hot electrons

The oscillator can experience fluctuations in oscillating frequency due to one or more environmental factors. One environmental factor is the presence of hot electrons. FIGS. 4A–4B show exemplary hot electron sensors 12, which can be deep well diodes. The term hot-electron effect refers to the phenomenon of electrons which originate from FET surface channel currents, from impact ionization currents at the FET drain junction, or from substrate leakage currents. Electrons drifting from the gate may gain sufficient energy to enter into the gate, or they may collide with the silicon atoms and generate electron-hole pairs. The hole adds to substrate current, and the secondary electron may be injected into the gate of a subsequent FET. The deep well diodes sense the hot electron effect and provide this information eventually to the processor 20 to automatically compensate for hot electron effects To provide calibration data for hot electron characterization of the IC, the analog portion also includes one or more hot electron generators such as small ring oscillators.

Turning now to FIG. 4A, a substrate hot electron sensor that senses hot electron presence during operation is shown. A substrate portion 140 is covered by a metal layer 142 The substrate portion 140 is processed to include n-well regions 144 and 148. Various n+ regions 146 and 150 are positioned within the substrate portion 140. Additionally, various p+ regions 152 and 154 are positioned within the substrate portion 140. The circuit of FIG. 4A forms four diodes: a diode formed by the n+ region 150 and the p-sub region 143, a diode formed by the n-well 144 and the p-sub region 143, a diode formed by the p+ region and the p-sub region 143, and a diode formed by the n-well 148 and the p-sub region 143.

During operation, to sense hot electrons, the diodes of FIG. 4A are reverse biased. The processor 20 measures the current across the diodes. Hot electrons would not impact the p+ diode, but would affect the n+/psub diode and the n-well/psub diode in the form of an increase in current across the these diodes.

Referring to FIG. 4B, an embodiment that senses device degradation due to hot electrons is shown. The embodiment of FIG. 4B has a transistor 160 that senses hot electrons. The drain of the transistor 160 is connected to a resistor 162, while the source of the transistor 160 is connected to a second resistor 164. The output of the transistor 160 drives an analog to digital converter (ADC) 166, whose output is provided to the CPU 20. The CPU 20 is connected to a digital to analog converter 168 that excites the transistor 160. The processor 20 periodically captures hot electron activity through the ADC 166 and stores this information in memory. The information is used to calibrate the device for hot electron characteristics.

Various shock sensors 14 can be used. In one embodiment, the shock sensor 14 is a semiconductor acceleration sensor manufactured by means of film formation or etching on a semiconductor wafer, as discussed in U.S. Pat. No. 6,158,283 to Shinogi, et al The semiconductor acceleration sensor manufactured according to micro machining technology. A silicon substrate I is etched to form a cantilever and a dead-weight. The cantilever can be made thinner than any other portion by etching and deformed with acceleration in a direction indicated by an arrow. A quantity of deformation of the cantilever is detected by the piezoresistance effect of a diffused resistor formed on the upper surface of the cantilever, and the acceleration is obtained by comparing the obtained quantity with that from a diffused resistor.

Figure 5:
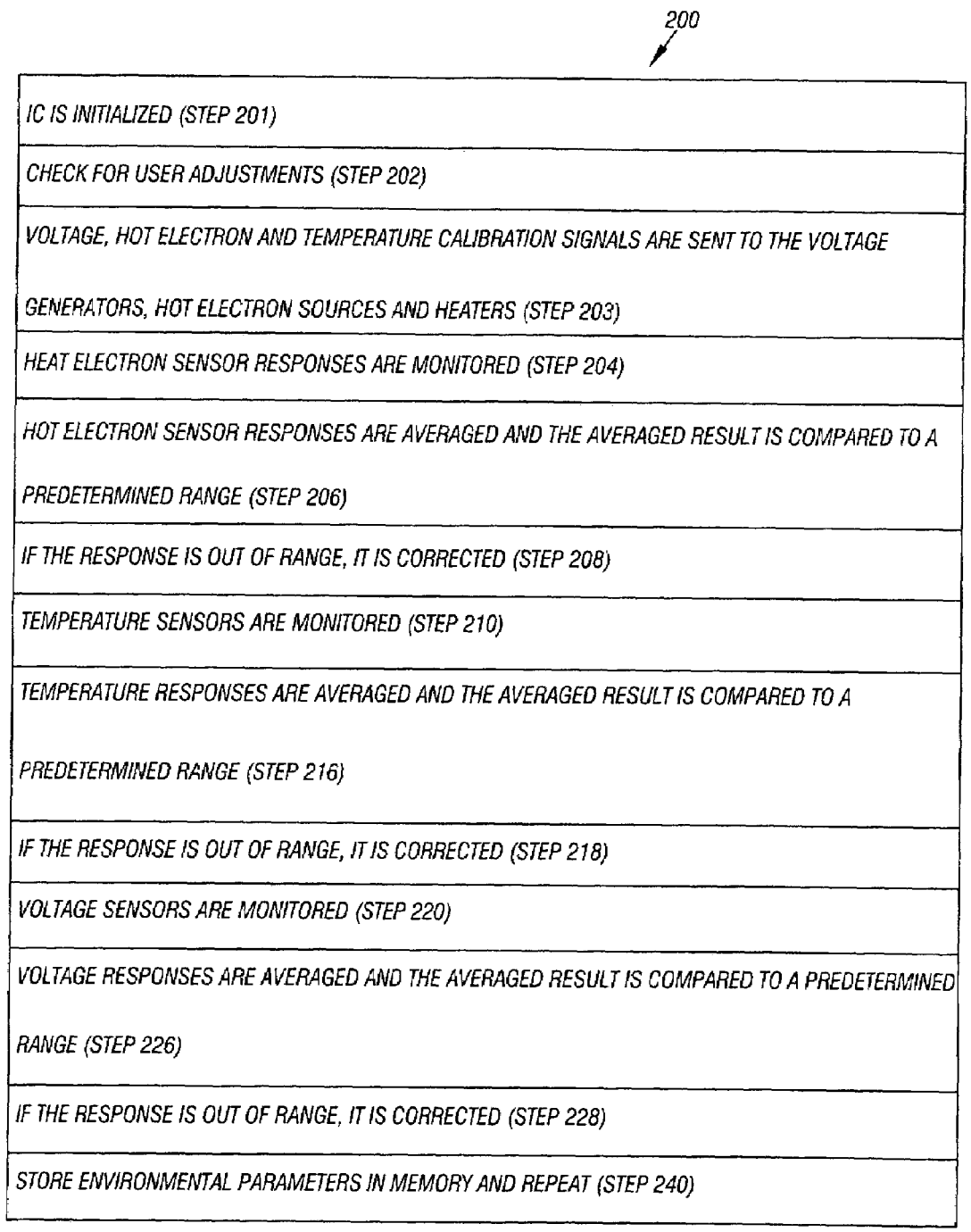
FIG. 5 shows an exemplary process for calibrating and correcting an integrated circuit.

In addition to the temperature adjustments made by the controller, the system can also detect the supply voltage that the system is presently operating at and adjust for variations in the supply voltage. Like the temperature, the voltage represents an offset from the nominal voltage setting. If the operating voltage is not at a nominal value, the controller adjusts the ring oscillator delay path to compensate for the voltage differential. Environmental parameters of the IC include temperature, supply voltage and other external parameters which affect the performance of the IC An exemplary process of calibrating and correcting the IC 10 is shown in the flow chart 200 of FIG. 5. First, the IC 10 is initialized (step 201). The process 200 checks for user adjustments (step 202). If a user wants to adjust the operating frequency of the clock to meet the temperature and voltage conditions of the application, the process 200 adds the adjustments so that the oscillator moves toward the user specified operating frequency.

Next, in step 203, voltage, hot electron and temperature calibration signals are sent to the voltage generators, hot electron sources and heaters, respectively These calibration signals are preferably generated by the processor 20 of FIG. 1 so that they have a known level and can be swept over a known test range. In process step 204, the hot electron sensor responses are monitored. In decision step 206, the hot electron sensor responses are averaged and the averaged result is compared to a predetermined range. If the response is out of range, it is corrected in process step 208. The above steps are performed for each sensor type. For example, in step 210, the temperature sensors are monitored. In decision step 216, the temperature responses are averaged and the averaged result is compared to a predetermined range. If the response is out of range, it is corrected in process step 218. Next, in step 220, the voltage sensors are monitored. In decision step 226, the voltage responses are averaged and the averaged result is compared to a predetermined range. If the response is out of range, it is corrected in process step 228. In the above manner, each sensor type is monitored and the environment sensed by the sensor type is adjusted. For example, if the temperature gets hotter (indicating slower silicon and slower ring oscillator) the flash system will move the oscillator settings to the faster settings to compensate for the slow down because of increased temperature or a corresponding decrease in operating voltage.

The data is continually collected. This is done by having the processor 20 instruct a switch to connect to each sensor in seriatim and the ADC to digitize the environmental parameters, and the FLASH memory file to store the output of the ADC (step 240). The FLASH memory file can store one sample point for each sensor, or can store historical data for the sensors.

To keep a constant clock frequency, the process 200 moves the oscillator as to the environmental changes. Moreover, the, processor 20 can predict the environmental changes based on historical data.

Additionally, the process can calibrate sub-systems For example, with respect to the wireless transceiver, responses that can be calibrated and corrected in with calibration signals from the processor 20 can include transmit/receive gain over temperature, transmit/receive gain over voltage, transmit/receive gain over hot electron effect, and frequency responses of the PLL's voltage-controlled oscillator and frequency steps of a phased-lock loop as function of voltage, temperature and hot electron level, for example. This process of calibration and correction can be conducted for each sub-system of the IC 10.

The term "FLASH memory" is used above to generally describe any non-volatile technology. The present invention applies to all non-volatile floating gate technologies such as EEPROM and FLASH memory. Additionally, RAM storage where the contents of the RAM are maintained for an extended period (more than 1 year) by an external battery source would also be within the scope contemplated by the present invention as well as any method of memory that is erasable and electrically programmable.

Moreover, although a self-calibrated clock has been discussed above, other self-calibrated functions are contemplated and within the scope of the invention. These functions include: analog-to-digital converter, digital-to-analog converter, voltage reference, current reference, timer, amplifier having a calibrated frequency response (high or low pass filter), offset voltage adjustment, bandpass filter (frequency detection), television or radio tuner, temperature transducer amplifier (linear and non-linear temperature profiles), pressure transducer amplifier, analog multiplier and divider, among others.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

The invention claimed is:

1. A clock oscillator embedded in an integrated circuit, comprising:
   a piezoelectric resonator formed on a substrate of the integrated circuit;
   a clock generator formed on the substrate and coupled to the piezoelectric resonator;
   sensors adapted to sense one or more environmental parameters affecting the piezoelectric resonator, the one or more sensors including a temperature sensor, a hot electron sensor, and a shock sensor;
   a processor coupled to the clock generator and the sensors and adapted to process the one or more environmental parameters and adjust the frequency of the clock generator based on the one or more environmental parameters; and
   a primary oscillator coupled to the clock generator to be calibrated by the frequency of the clock generator.

2. The oscillator of claim 1, wherein the environmental parameters includes temperature and supply voltage.

3. The oscillator of claim 1, wherein the sensors include one or more supply voltage sensors.

4. The oscillator of claim 1, wherein the piezoelectric resonator comprises an integrated piezo-electric film formed on the substrate.

5. The oscillator of claim 1, wherein the piezoelectric resonator comprises an integrated ZnO film formed on the substrate.

6. The oscillator of claim 1, wherein the piezoelectric resonator further comprises a doped polysilicon cantilever deposited over a pit of the substrate.

7. The oscillator of claim 6, further comprising a polysilicon layer deposited and patterned and a boron layer implanted into the polysilicon layer, wherein the polysilicon layer is undercut.

8. The oscillator of claim 1, wherein the hot electron sensor comprises a plurality of diodes to be reversed biased to sense hot electrons.

9. The oscillator of claim 1, wherein the primary oscillator comprises a ring oscillator coupled to an oscillator stage, the oscillator stage having an output to drive a phase locked loop.

10. The clock oscillator of claim 1, wherein the processor comprises a central processing unit.

11. A method comprising:
receiving information regarding environmental parameters of an integrated circuit from formed on a substrate of sensors, wherein the integrated circuit includes a temperature sensor, a hot electron sensor, and a shock sensor;
processing the information in a processor of the substrate to generate control signals;
adjusting a frequency of a clock oscillator formed on the substrate using the control signals, wherein the clock oscillator includes a piezoelectric resonator formed on the substrate; and
adjusting a delay value of a ring oscillator based on the information, wherein the information relates to an operating voltage of the integrated circuit.

12. The method of claim 11, further comprising:
receiving temperature information from multiple temperature sensors of the integrated circuit;
manipulating the temperature information into a temperature result; and
comparing the temperature result to a predetermined range.

13. The method of claim 12, further comprising adjusting the frequency of the clock oscillator when the temperature result is out of the predetermined range.

14. An integrated circuit (IC) comprising:
a controlled oscillator including a silicon piezoelectric resonator;
a plurality of sensors coupled to the controlled oscillator, the plurality of sensors each configured to sense an operating parameters of the IC and including a temperature sensor, a hot electron sensor, and a shock sensor; and
a processor coupled to the plurality of sensors, the processor configured to process an output of the plurality of sensors and to control the controlled oscillator based on the output of the plurality of sensors.

15. The IC of claim 14, wherein the silicon piezoelectric resonator comprises a portion of a substrate of the IC having a doped layer located thereon and wherein the portion of the substrate is undercut.

16. The IC of claim 14, wherein the controlled oscillator, the plurality of sensors and the processor are formed on a single substrate.

* * * * *